US006963490B2

(12) United States Patent
McClary

(10) Patent No.: US 6,963,490 B2
(45) Date of Patent: Nov. 8, 2005

(54) METHODS AND APPARATUS FOR CONDUCTIVE COOLING OF ELECTRONIC UNITS

(75) Inventor: Charles R. McClary, Spring Lake Park, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/705,055

(22) Filed: Nov. 10, 2003

(65) Prior Publication Data

US 2005/0099777 A1 May 12, 2005

(51) Int. Cl.[7] .................................................. H05K 7/20

(52) U.S. Cl. ....................... 361/704; 361/719; 361/721; 165/80.3; 165/185; 174/16.3

(58) Field of Search ................................ 361/704, 707, 361/709, 713, 715, 719–721, 727, 754, 756; 174/16.1, 16.3, 52.1; 165/80.3, 185

(56) References Cited

U.S. PATENT DOCUMENTS

| | | | | | |
|---|---|---|---|---|---|
| 4,093,021 | A | | 6/1978 | Groom | |
| 4,298,904 | A | * | 11/1981 | Koenig | 361/720 |
| 4,458,296 | A | | 7/1984 | Bryant et al. | |
| 4,825,337 | A | * | 4/1989 | Karpman | 361/716 |
| 4,994,937 | A | * | 2/1991 | Morrison | 361/715 |
| 5,208,733 | A | * | 5/1993 | Besanger | 361/704 |
| 5,400,217 | A | | 3/1995 | Whitson et al. | |
| 5,459,352 | A | * | 10/1995 | Layton et al. | 257/724 |
| 5,483,420 | A | * | 1/1996 | Schiavini | 361/707 |
| 5,682,943 | A | * | 11/1997 | Yao et al. | 165/104.21 |
| 5,859,764 | A | * | 1/1999 | Davis et al. | 361/704 |
| 5,883,784 | A | * | 3/1999 | Hughes et al. | 361/707 |
| 5,999,407 | A | * | 12/1999 | Meschter et al. | 361/704 |
| 6,061,243 | A | * | 5/2000 | Barnett et al. | 361/704 |
| 6,169,658 | B1 | | 1/2001 | Arena et al. | |
| 6,205,023 | B1 | * | 3/2001 | Moribe et al. | 361/704 |
| 6,212,075 | B1 | * | 4/2001 | Habing et al. | 361/719 |
| 6,278,611 | B1 | | 8/2001 | Arena et al. | |
| 6,678,159 | B1 | * | 1/2004 | Barcley | 361/704 |
| 6,765,798 | B1 | * | 7/2004 | Ratliff et al. | 361/704 |
| 2002/0018337 | A1 | | 2/2002 | Nakamura | |
| 2003/0030986 | A1 | * | 2/2003 | Centola et al. | 361/720 |

FOREIGN PATENT DOCUMENTS

| | | |
|---|---|---|
| CH | 658 158 A5 | 10/1986 |
| EP | 0 848 469 A | 6/1998 |

OTHER PUBLICATIONS

PCT International Search Report and Written Opinion for International Application No. PCT/US2004/036465, International Filing Date Jan. 11, 2003, 11 pp.

* cited by examiner

*Primary Examiner*—Boris Chervinsky
(74) *Attorney, Agent, or Firm*—Andrew Abeyta, Esq.; Armstrong Teasdale LLP

(57) ABSTRACT

A method for configuring an electronic unit having a plurality of sides for conductive cooling is described. The electronic unit is configured to be mounted in a mounting rack and the method comprises attaching a heat conduction mechanism including an expandable heat transferring structure to the electronic unit. The heat conduction mechanism is expandable to contact a surface of the mounting rack upon activation, thereby conductively transferring heat from the electronic unit to the mounting rack.

24 Claims, 7 Drawing Sheets

METHODS AND APPARATUS FOR CONDUCTIVE COOLING OF ELECTRONIC UNITS

BACKGROUND OF THE INVENTION

This invention relates generally to controlling temperatures within operating electronic units, and more specifically, to methods and apparatus for conductive cooling of electronic units.

Three ways to remove heat from electronic units include radiation, convection, and conduction. Typical electronic equipment rack installations, for example, those utilized for mounting of various electronic equipment in aircraft, are sometimes designed for forced air cooling, the forced air being blown through the electronic unit, which removes heat via convection. However, forced air cooling of electronic units also includes ducting for the routing of the forced air from an air pressure source, the air source, filtering, and other mechanisms which work to provide a positive pressure at each of the electronic units being cooled. In addition, the above described mechanisms for forced air cooling take up space, which is typically at a premium in an aircraft. Forced air cooling is sometimes referred to as blow through cooling.

In radiation cooling, a typical electronic unit is painted black or with some other high emissivity coating to maximize passive cooling through radiation. Sometimes however, other electronic equipment operating nearby is at approximately the same temperature. In such situations, radiation can become an inefficient method for cooling of electronic units.

Cooling through conduction would help to eliminate some of the equipment used in forced air cooling and could also overcome some of the inefficiencies of radiation cooling. Easy removal and replacement of electronic units, for example, in air vehicles, is also a consideration. Present electronic equipment installations include features and mechanisms that provides for easy removal and replacement of electronic units in the example equipment rack installations. These same ease of removal and replacement features have heretofore hindered development of conductive cooling mechanisms.

BRIEF SUMMARY OF THE INVENTION

In one aspect, a method for configuring an electronic unit having a plurality of sides for conductive cooling, the electronic unit to be mounted in a mounting rack is provided. The method comprises attaching a heat conduction mechanism including an expandable heat transferring structure to the electronic unit. The heat conduction mechanism is expandable to contact a surface of the mounting rack upon activation, thereby conductively transferring heat from the electronic unit to the mounting rack.

In another aspect, a method for conductively cooling an electronic unit is provided. The electronic unit includes a heat conduction mechanism including an expandable heat transferring structure attached thereto. The method comprises mounting the electronic unit in a mounting rack and expanding the heat conduction mechanism to contact a surface of the mounting rack.

In still another aspect, a chassis for an electronics device is provided. The chassis comprises a heat conduction mechanism mounted to at least one side of the chassis. The heat conduction mechanism is configured in a heat transfer relationship with a mounting rack onto which the chassis is to be mounted to conductively remove heat from the chassis.

In yet another aspect, an electronic device which comprises a chassis configured for mounting within a mounting rack and a heat conducting mechanism attached to the chassis is provided. The heat conduction mechanism is configured to expand to engage a surface of the mounting rack thereby conductively removing heat from the chassis.

DETAILED DESCRIPTION OF THE INVENTION

Figure 1:
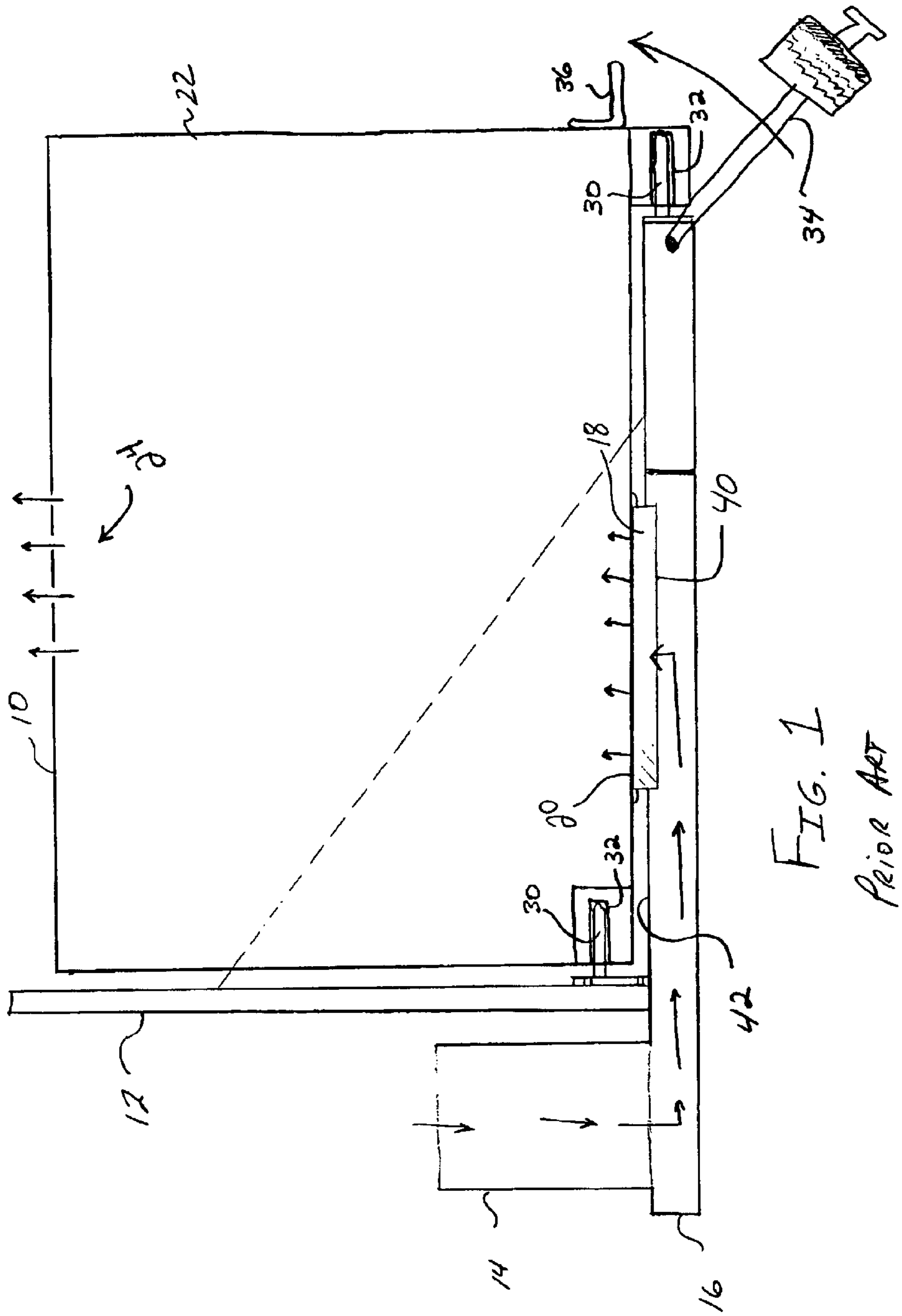
FIG. 1 is a side view of an electronic unit mounted on a mounting rack utilizing forced air cooling.

FIG. 1 is a diagram of an electronic unit 10 mounted on a mounting rack 12. Electronic unit 10 utilizes forced air cooling and mounting rack 12 is configured with features which accommodate forced air cooling. Mounting rack 12 includes an air plenum 14 and a hollow frame portion 16. As shown, mounting rack 12 is configured such that electronic unit 10 can be mounted thereto. As used herein, mounting rack 12 also includes shelves which do not include air plenums 14 and hollow frame portions 16, but which have suitable mounting features for the mounting of electronic units 10.

A hollow frame portion 16 of frame 12 is hollow so that cooling air (depicted by the arrows) from a cooling air source (not shown) can be routed to plenum 14, through hollow frame portion 16, and into electronic unit 10 at cooling air interface 18. Electronic unit 10 which is attached to frame 12 includes holes in a bottom 20 of its chassis 22 which align with cooling air interface 18. The cooling air passes through electronic unit 10 and eventually exits electronic unit 10, for example, at air exit 24, carrying at least some of the heat generated by operation of electronic unit 10.

For precise alignment, mounting rack 12 further includes guide pins 30 which engage mounting bores 32 formed in chassis 22 of electronic unit 10. Mounting rack 12 also includes one or more pivotably attached threaded retention clips 34 which engage tangs 36 extending from chassis 22 of electronics unit and help to retain electronic unit 10 on mounting rack 12. Mounting rack 12 is representative of other types of electronic equipment mounting devices which utilize forced air cooling in that they employ an interface to a forced air system (e.g. plenum 14) and that the device be configured to route the cooling air to specific locations to enter the electronics unit to be cooled. The interface to the cooling air, plenum 14, and the "ducting" (e.g. hollow frame portion 16) within the mounting devices add cost, weight, and take away from what is typically an already small area in many applications.

In certain applications, for example, when electronic unit 10 is a type of inertial reference unit, guide pins 30 and mounting bores 32 are precision machined so that electronic unit 10 is retained in a specific orientation on mounting rack 12. Additionally, and in other applications, cooling air interface 18 includes a gasket 40 which helps to prevent cooling air from escaping from the desired path into electronic unit 10. In all of these applications, bottom 20 of chassis 22 is largely prevented from making contact with surface 42 of mounting rack 12, thereby impeding conductive cooling from taking place. Similar to mounting rack 12, certain shelves which do not use cooling air, but utilize guide pins 30 and mounting bores 32 are known. With such shelves, a chassis of an electronic unit is again largely prevented from making contact with any surfaces of the shelves, also reducing an amount of conductive cooling.

Figure 2:
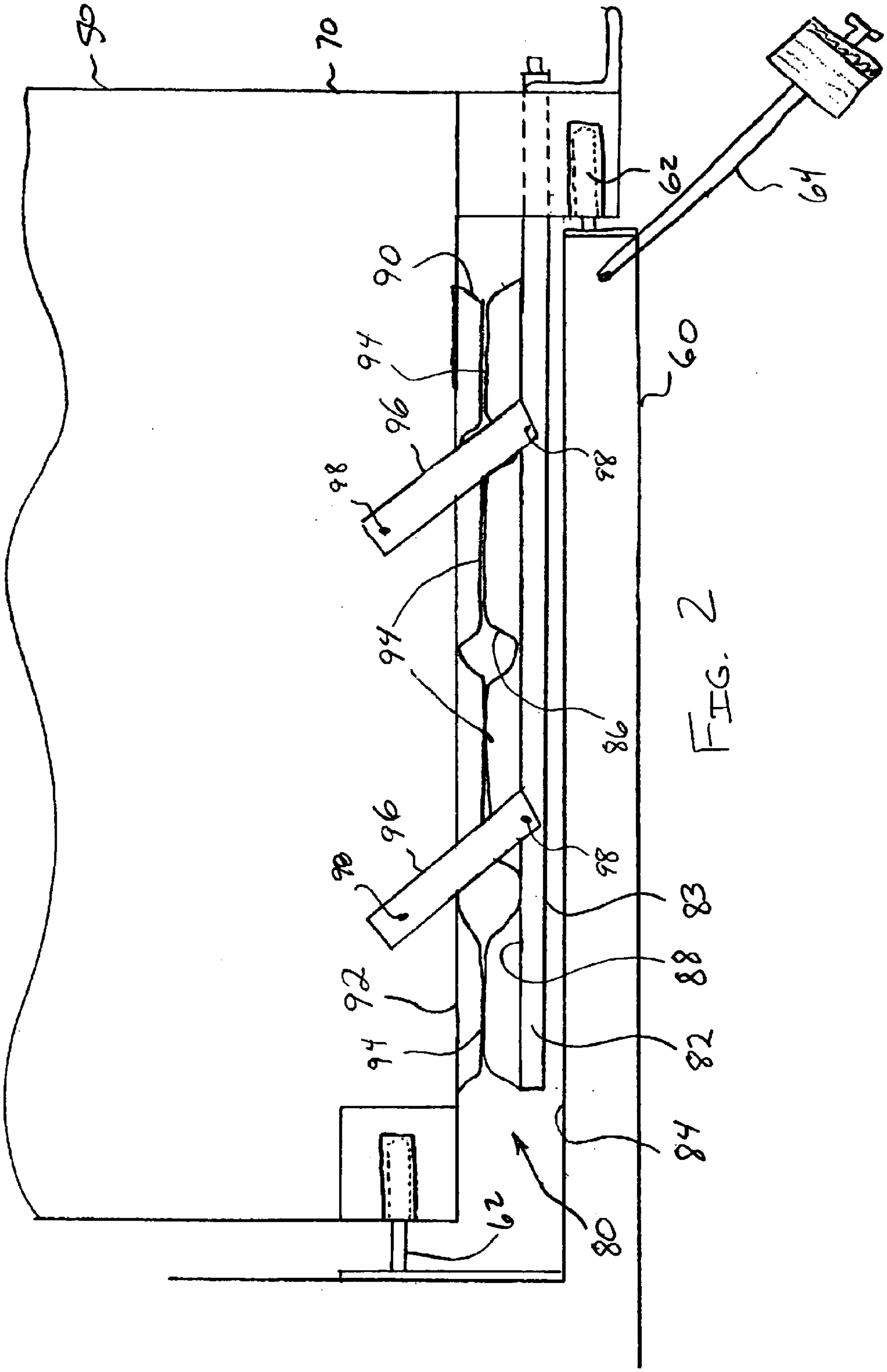
FIG. 2 is a side view of an electronic unit mounted on a mounting rack, the electronic unit including a heat conduction mechanism.

FIG. 2 illustrates an electronics unit 50 mounted on conductive cooling mounting rack 60 (shown in partial view). Conductive cooling mounting rack 60 is similar to mounting rack 12 (shown in FIG. 1), for example, including guide pins 62 and pivotably attached threaded retention clips 64 which operate to engage and retain electronic unit 50 as described above.

Electronic unit 50 includes an equipment chassis 70 and a heat conduction mechanism 80. In the embodiment shown, heat conduction mechanism 80 includes a plate portion 82 having a bottom 83 that is configured to make physical contact with a surface 84 of mounting rack 60. Heat conduction mechanism 80 further includes a heat transferring structure 86 that is attached to a top 88 of plate portion 82.

A second heat transferring structure 90 is attached to a bottom 92 of equipment chassis 70. In one embodiment, heat transferring structure 86 and second heat transferring structure 90 are connected together at connection points 94, for example, through a welding process. In the embodiment shown, heat transferring structure 86 and second heat transferring structure 90 are corrugated in shape, allowing the attachment between the two to be made.

Equipment chassis 70 is attached to plate portion 82 of heat conduction mechanism 70 utilizing pivoting brackets 96. Pivoting brackets 96 are rotatably coupled to each of equipment chassis 70 and plate portion 82 of heat conduction mechanism 80 utilizing coupling pins 98. Although heat transferring structure 86 and second heat transferring structure 90 are connected together, heat transferring structure 86 and second heat transferring structure 90 are flexible enough that plate portion 82 can be moved somewhat with respect to equipment chassis 70, the movement at least partially allowed by the pivoting motion of pivoting brackets 96.

In one embodiment, heat conduction mechanism 80 incorporates a single heat transferring structure 86 which is attached to both plate portion 82 and bottom 92 of equipment chassis 70. Plate portion 82, heat transferring structure 86, and second heat transferring structure 90, in any of the above described embodiments, are constructed from materials which have good heat conductivity, for example, most metals.

Figure 3:
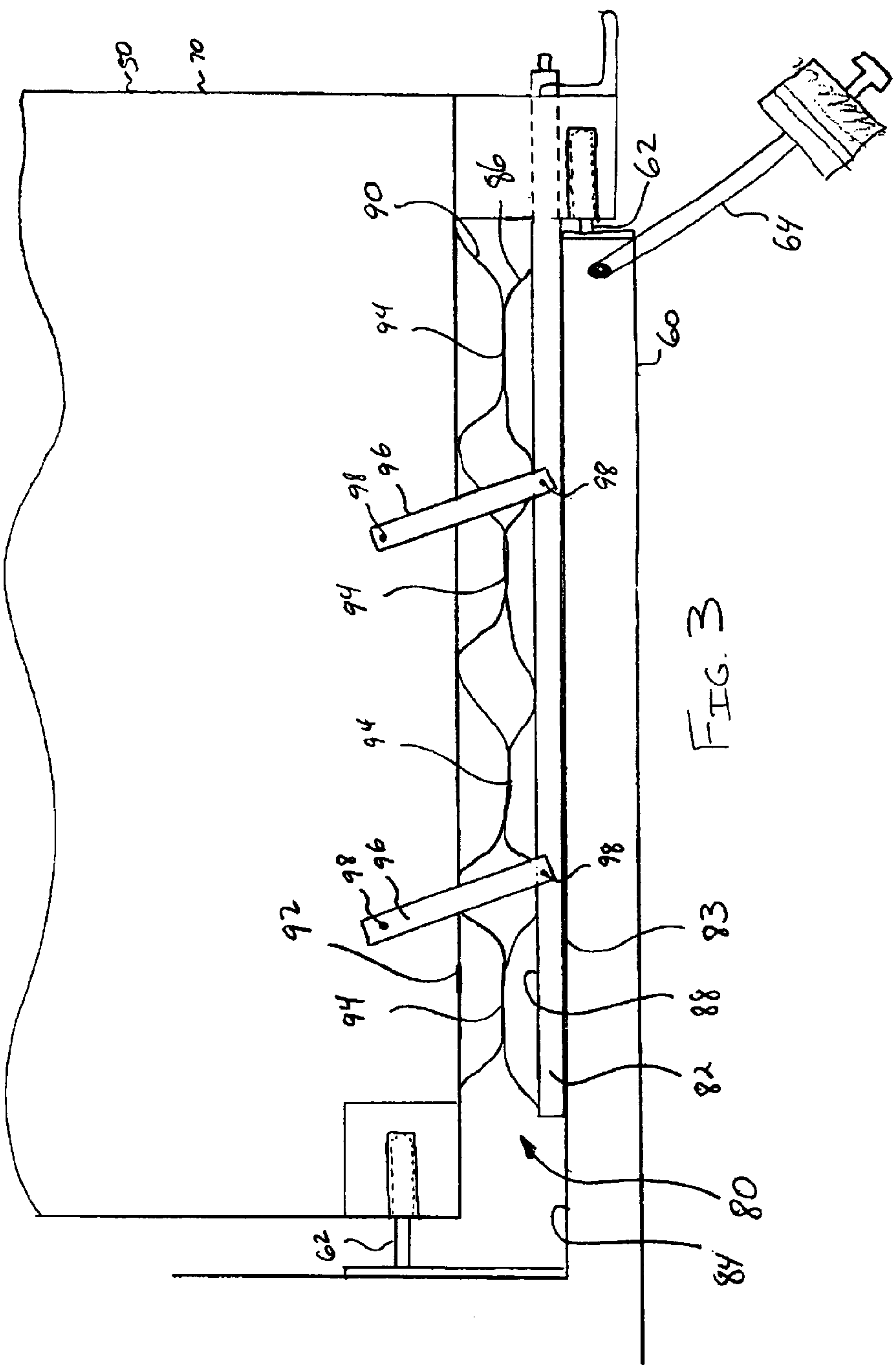
FIG. 3 is another side view of the device of FIG. 2, illustrating engagement of the heat conduction mechanism with the mounting rack.

FIG. 3 illustrates engagement of heat conduction mechanism 80 and mounting rack 60 when heat conduction mechanism 80 is moved with respect to equipment chassis 70, the movement being constrained by pivoting brackets 96 and the flexibility of heat transferring structure 86 and second heat transferring structure 90. In the embodiment shown, when plate portion 82 of heat conduction mechanism 80 is moved to engage surface 84 of mounting rack 60, heat transferring structure 86 and second heat transferring structure 90 are somewhat expanded. One result of a physical engagement between heat conduction mechanism 80 and mounting rack 60 is that heat generated by operation of electronic unit 50 is conductively transferred from equipment chassis 70 through second heat transferring structure 90, through heat transferring structure 86 to heat plate portion 82 of heat conduction mechanism 80. Heat transferred to plate portion 82 of heat conduction mechanism 80 is further conductively transferred to mounting rack 60. The above described heat transfer process is effective enough to cool many electronic units that now rely on forced air cooling.

In any of the above described embodiments, heat transferring structure 86, second heat transferring structure 90, and combinations thereof provide a high heat conduction attachment to an electronic unit (e.g. electronic unit 50) to be cooled. In addition, surfaces or features of plate portion 82, heat transferring structure 86 and/or second heat transferring structure 90 provide a high heat conduction path to a sink (e.g. mounting rack 60) of heat for cooling of electronic unit 50. Further, heat transferring structure 86 and second heat transferring structure 90 provide an expandable medium of heat conduction between surfaces of equipment chassis 70 and mounting rack 60. In one embodiment, heat transferring structure 86 and second heat transferring structure 90 are constructed from an expandable, heat conducting material which includes features allowing for its attachment to one or more sides of equipment chassis 70 and plate portion 82 of heat conduction mechanism 80.

Figure 4:
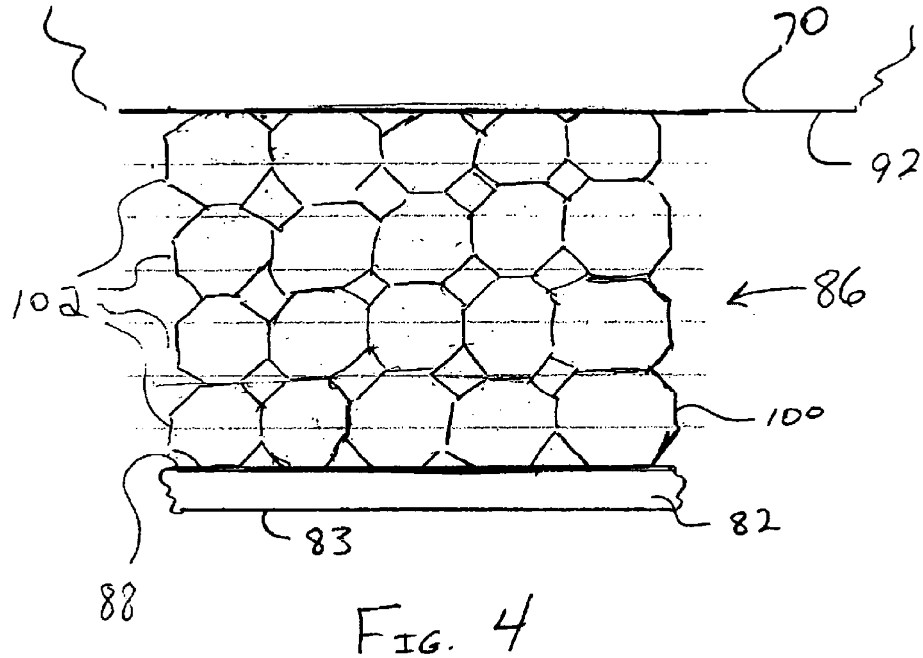
FIG. 4 is diagram illustrating a honeycomb heat transferring structure.

As described above, some embodiments of heat conduction mechanism 80 incorporate a single heat transferring structure 86 which is attached to both top 88 of plate portion 82 and bottom 92 of equipment chassis 70. One example of a single heat transferring structure is a honeycomb structure 100 with a multiplicity of cells 102, which is shown in FIG. 4. As shown, honeycomb structure 100 extends from top 88 of plate portion 82 to bottom 92 of equipment chassis 70. In one embodiment, the movement of plate portion 82 is constrained by pivoting brackets 96 (not shown) and the flexibility of honeycomb structure 100.

Figure 5:
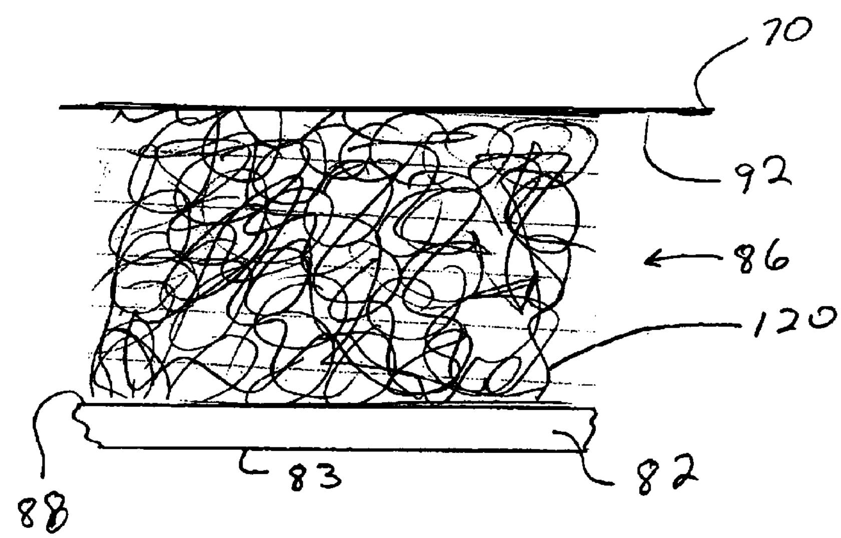
FIG. 5 is diagram illustrating a wool like heat transferring structure.
Figure 6:
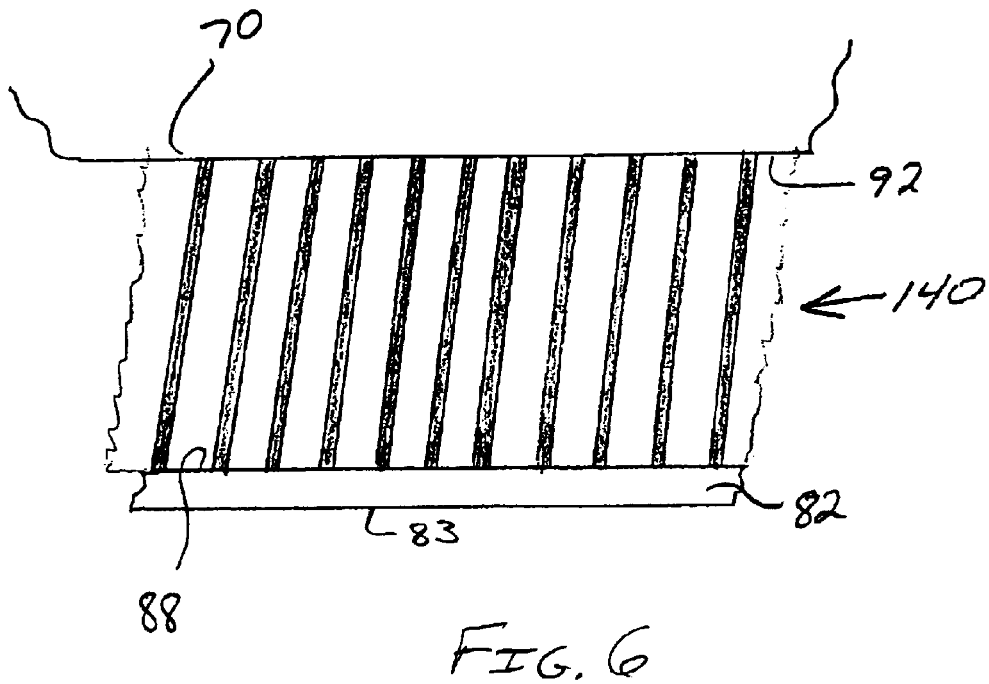
FIG. 6 is diagram illustrating a metal filled elastomer heat transferring structure.

Another embodiment of a single heat transferring structure is a wool like structure 120, which in one embodiment is constructed from a mass of compressible wire, as shown in FIG. 5. Wool like structure 120 extends between top 88 of plate portion 82 and bottom 92 of equipment chassis 70. Still another embodiment of a single heat transferring structure is shown in FIG. 6, which is a metal filled elastomer 140 extending from top 88 of plate portion 82 to bottom 92 of equipment chassis 70. In these embodiments, the movement of plate portion 82 is again constrained by pivoting brackets 96 (not shown) and the flexibility of wool like structure 120 and metal filled elastomer 140 respectively.

The heat transferring structure 86 and second heat transferring structure 90, and the embodiments described herein (i.e., honeycomb structure 100, wool like structure 120, and metal filled elastomer 140) are composed, at least in part, from materials that exhibit a low thermal resistance, and therefore, a high coefficient of heat conductance. Examples are most metals such as aluminum, copper, steel, beryllium copper and metal filled elastomer. The shapes and configurations are those that provide for expansion to fill the gap, when activated, between the chassis of an electronic unit and a surface of a mounting device.

Figure 7:
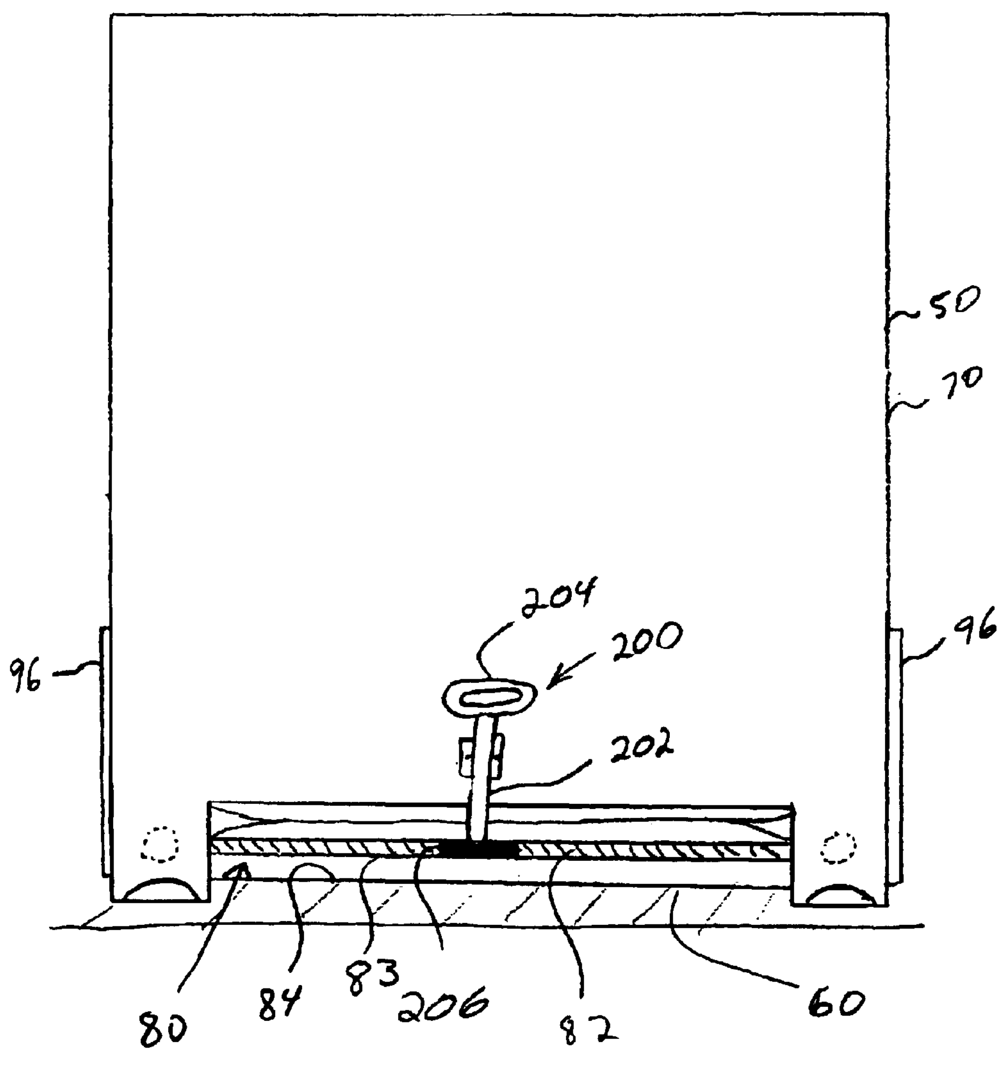
FIG. 7 is a front view of the device of FIG. 2, illustrating a lever activation mechanism for engaging the heat conduction mechanism with the mounting rack.

FIG. 7 illustrates one embodiment of an activation mechanism 200 that is utilized to engage a bottom 83 of plate portion 82 of heat conduction mechanism 80 with surface 84 of mounting rack 60. In the embodiment shown, activation mechanism 200 includes a locking lever 202 with a handle 204 that is movably mounted to equipment chassis 70. A stationary engagement block 206 is mounted to plate portion 82 of heat conduction mechanism 80. In the embodiment shown, locking lever 202 presses against stationary engagement block 206, forcing plate portion 82 downward. As described above with respect to FIG. 3, heat transferring structure 86 and second heat transferring structure 90 are expanded somewhat by the action of locking lever 202, completing the conductive path for the heat from electronic unit 50 to mounting rack 60.

Figure 8:
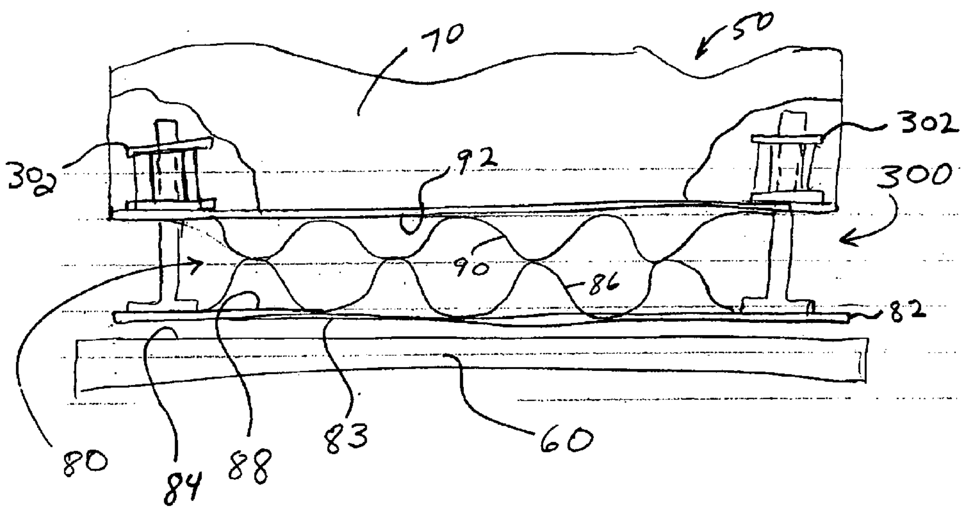
FIG. 8 is a partial side view of the device of FIG. 2, illustrating a solenoid activation mechanism for engaging the heat conduction mechanism with the mounting rack.

FIG. 8 illustrates a side view of an activation mechanism 300 which includes solenoids 302 that are utilized to engage a bottom 83 of plate portion 82 of heat conduction mechanism 80 with surface 84 of mounting rack 60 upon activation. Solenoids 302 are connected between electronic unit 50 and top 88 of plate portion 82. In one embodiment, additional solenoids 302 (not shown) are utilized in electronic unit 50 (e.g., approximate four bottom corners) to provide an even force to plate portion 82 as it contacts surface 84 of mounting rack 60. In one embodiment, solenoids 302 are activated by application of power to electronic unit 50. An external activation of solenoids 302, for example, by an installer of electronic unit 50 is also contemplated.

Figure 9:
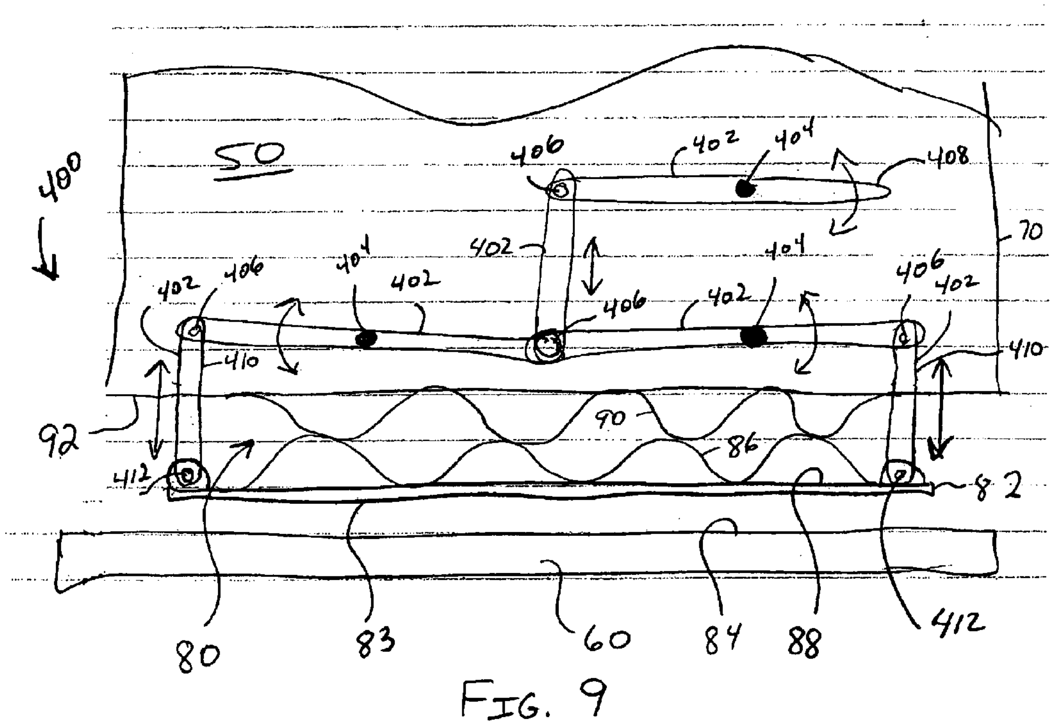
FIG. 9 is a partial side view of the device of FIG. 2, illustrating interconnected levers for engaging the heat conduction mechanism with the mounting rack.

FIG. 9 illustrates another embodiment of an activation mechanism 400 which includes a system of levers 402 that is utilized to engage a bottom 83 of plate portion 82 of heat conduction mechanism 80 with surface 84 of mounting rack 60. In one embodiment, a second activation mechanism 400 (not shown) is incorporated on an opposite side of electronic unit 50. Certain of levers 402 are pivotably attached to electronic units 50 at pivot points 404, and other of levers 402 are pivotably attached to one another at pivot points 406 so that activation of handle lever 408 causes a downward motion of plate portion 82. Plate engaging levers 410 are pivotably coupled to plate portion 82 at pivot points 412 to enable the downward (and upward) motion of plate portion 82 as levers 402 are rotated about pivot points 404 and 406. Activation mechanism 400 is further configured with one or more detent points (not shown) which lock activation mechanism 400 in place when plate portion 82 is in contact with mounting rack 60 or when plate portion is full disengaged from mounting rack 60. Other mechanisms which perform the operation of activation mechanisms 200, 300, and 400 are also contemplated, including any mechanical interconnection between a chassis 70 of electronic unit 50 that causes plate portion 82 to contact mounting rack 60.

In the non-expanded position (FIG. 2), the methods and apparatus described herein for conductive heat transfer from electronic units also provide for ease of removal and replacement of electronic units 50 from mounting racks 60. In addition, the methods and apparatus in the expanded position (FIG. 3) provides a low resistance, heat conductive path to transfer the heat generated by operation of electronic unit 50, passively, to a sink of heat (e.g. mounting rack 60 and any source of conduction that mounting rack 60 is attached to).

Typical electronic equipment mounting configurations for commercial aircraft allow for ease of removal and include forced air cooling for electronic units. Passively cooled electronic equipment mounted in these mounting racks are severely limited in heat dissipation from conduction. Heat dissipation is limited in part, due to the proximity of other electronic units, most of which generate heat. Another cause of limited heat dissipation is due to little or no physical contact between the electronic units and their mounting racks, as shown and described with respect to FIG. 1. The methods and apparatus described herein incorporate features to maximize passive cooling due to increased conductive paths while retaining the physical mounting features that provide ease of removal and replacement of such electronic units. Additionally, the mounting racks described herein are typically connected to an additional structure that provides a substantial heat sink.

While the invention has been described in terms of various specific embodiments, those skilled in the art will recognize that the invention can be practiced with modification within the spirit and scope of the claims.

What is claimed is:

1. A method for configuring an electronic unit having a plurality of sides for conductive cooling, the electronic unit to be mounted in a mounting rack, said method comprising attaching a heat conduction mechanism including an expandable heat transferring structure to the electronic unit, the heat conduction mechanism expandable to contact a surface of the mounting rack upon activation, thereby conductively transferring heat from the electronic unit to the mounting rack.

2. A method according to claim 1 wherein attaching a heat conduction mechanism comprises configuring the heat conduction mechanism with an activation mechanism, the activation mechanism operable to expand the heat transferring structure between the electronic unit and the mounting rack.

3. A method according to claim 2 wherein the activation mechanism comprises utilizing at least one of a locking lever, interconnected levers, and solenoid system operable to expand the heat transferring structure.

4. A method according to claim 1 wherein the heat conduction mechanism includes a plate portion, and wherein configuring a heat conducting mechanism comprises connecting the heat transferring structure between the electronic unit and the plate portion.

5. A method according to claim 4 wherein configuring a heat conducting mechanism comprises:

configuring a first heat transferring structure to extend from the electronic unit;

configuring a second heat transferring structure to extend from the plate portion of the heat conducting mechanism; and attaching the first heat transferring structure to the second heat transferring structure.

6. A method for conductively cooling an electronic unit, the electronic unit having a heat conduction mechanism including a plate portion attached to an expandable heat transferring structure, said method comprising:

mounting the electronic unit in a mounting rack; and expanding the heat conduction mechanism such that the plate portion contacts a surface of the mounting rack.

7. A method according to claim 6 wherein expanding the heat conduction mechanism comprises expanding the heat transferring structure between the electronic unit and the mounting rack.

8. A method according to claim 6 wherein the heat conduction mechanism further includes a second heat transferring structure attached to the electronic unit, the first heat transferring structure and the second heat transferring structure attached to on another, said expanding the heat conduction mechanism comprising expanding the first and second heat transferring structures such that the plate portion engages a surface of the mounting rack.

9. A method according to claim 6 wherein expanding the heat conduction mechanism comprises utilizing at least one of a locking lever, interconnected levers, and a solenoid system operable to expand the heat transferring structure.

10. A chassis for an electronics device comprising a heat conduction mechanism mounted to at least one side of said chassis, said heat conduction mechanism configured to expand to provide a heat transfer relationship with a mounting rack onto which said chassis is mounted to conductively remove heat from said chassis.

11. A chassis according to claim 10 further comprising an actuator configured to expand a portion of said heat conduction mechanism such that it engages a surface of the mounting rack.

12. A chassis according to claim 11 wherein said actuator is attached to said chassis and comprises one of a locking lever, interconnected levers, and a solenoid system operable to expand the heat transferring structure.

13. A chassis according to claim 10 wherein said heat conduction mechanism comprises:

a heat transferring structure; and a plate portion, said heat transferring structure being attached to said chassis and said plate portion such that said heat transferring structure is positioned between said plate portion and the side of said chassis to which it is attached.

14. A chassis according to claim 13 wherein said heat transferring structure comprises a first heat transferring structure and a second heat transferring structure, said first heat transferring structure being attached to said plate portion, said second heat transferring structure being attached to the side of said chassis, said first heat transferring structure and said second heat transferring structure being attached to one another.

15. A chassis according to claim 13 wherein said heat transferring structure extends between said plate portion and said chassis and comprises at least one of one or more corrugated structures, a honeycomb structure with a multiplicity of cells, a wool like structure, and a metal filled elastomer.

16. A chassis according to claim 13 wherein said heat transferring structure comprises one or more of aluminum, copper, steel, beryllium copper and a metal filled elastomer.

17. An electronic device for mounting in a mounting rack, said electronic device comprising:

a chassis configured for mounting within the mounting rack; and a heat conducting mechanism attached to said chassis, said heat conduction mechanism configured to expand to engage a surface of the mounting rack thereby conductively removing heat from said chassis.

18. An electronic device according to claim 17 wherein said heat conducting mechanism comprises:

a first heat transferring structure; and a plate portion comprising a surface, said first heat transferring structure mounted between said chassis and said plate portion, said first heat transferring structure configured to expand such that said surface of said plate portion engages a surface of the mounting rack.

19. An electronic device according to claim 18 comprising a second heat transferring structure, said first heat transferring structure mounted to said plate portion, said second heat transferring structure mounted to said chassis, said first and said second heat transferring structures attached to one another and configured to expand such at said surface of said plate portion engages a surface of the mounting rack.

20. An electronic device according to claim 18 wherein said heat conducting mechanism comprises a plurality of pivoting levers further coupling said chassis to said plate portion.

21. An electronic device according to claim 17 wherein said heat conducting mechanism comprises a heat transferring structure which comprises at least one of a corrugated structure, a honeycomb structure with a multiplicity of cells, a wool like structure, and a metal filled elastomer.

22. An electronic device according to claim 21 wherein said heat transferring structure comprises one or more of aluminum, copper, steel, beryllium copper and a metal filled elastomer.

23. An electronic device according to claim 17 comprising an activation mechanism, said activation mechanism configured to expand said heat conducting mechanism causing said heat conduction mechanism to contact a surface of the mounting rack.

24. An electronic device according to claim 23 wherein said activation mechanism comprises at least one of a locking lever, interconnected levers, an a solenoid system.

* * * * *